Figure 1A:
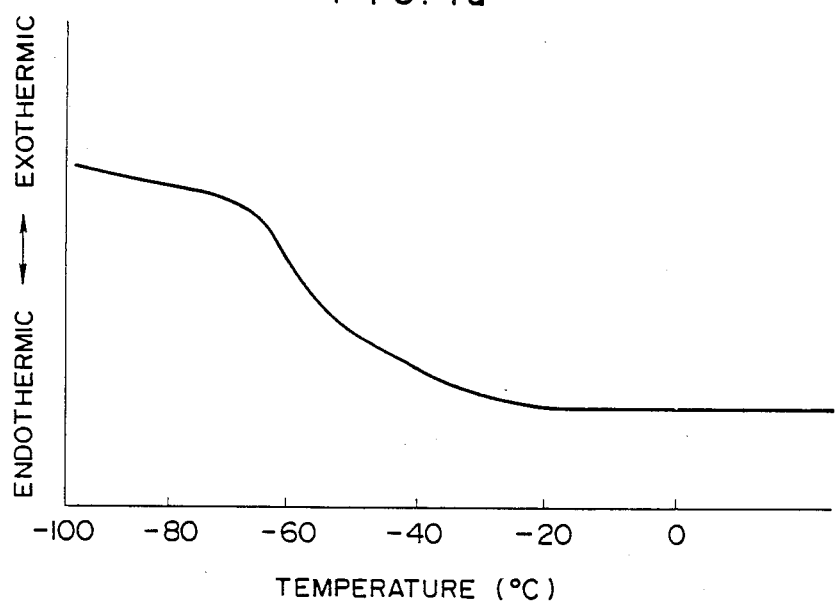

United States Patent [19]

Iwanaga et al.

[11] Patent Number: 4,985,513

[45] Date of Patent: Jan. 15, 1991

[54] CONJUGATED DIENE COPOLYMER, PROCESS FOR PRODUCING THE SAME, AND PHOTOSENSITIVE RESIN COMPOSITION COMPRISING THE SAME

[75] Inventors: Shin-ichiro Iwanaga; Tatsuaki Matsunaga; Ituo Nishiwaki, all of Yokkaichi; Hiroji Enyo, Suzuka, all of Japan

[73] Assignee: Japan Synthetic Rubber Co., Ltd., Tokyo, Japan

[21] Appl. No.: 336,112

[22] Filed: Apr. 11, 1989

Related U.S. Application Data

[62] Division of Ser. No. 124,870, Nov. 24, 1987, Pat. No. 4,927,738.

[30] Foreign Application Priority Data

Dec. 26, 1986 [JP] Japan .................................. 61-308133

[51] Int. Cl.$^5$ .................. C08F 220/20; C08F 220/06; C08F 236/04; G03F 7/033
[52] U.S. Cl. ........................................ 526/80; 526/79; 526/84; 526/85; 526/87; 526/318; 526/318.2; 526/318.25; 526/318.43; 526/318.45; 526/318.6; 430/287
[58] Field of Search .................. 526/79, 80, 84, 85, 526/87, 318, 318.2, 318.25, 318.43, 318.45, 318.6; 430/287

[56] References Cited

U.S. PATENT DOCUMENTS

| | | | |
|---|---|---|---|
| 3,775,518 | 11/1973 | Endo | 525/83 |
| 4,107,013 | 8/1978 | McGinniss | 522/85 |
| 4,125,675 | 11/1978 | Sekiguchi et al. | 503/214 |
| 4,141,868 | 2/1979 | Emmons et al. | 524/237 |
| 4,141,935 | 2/1979 | Dunkelberger | 428/463 |
| 4,163,763 | 8/1979 | Tsuchiya et al. | 525/290 |
| 4,199,619 | 4/1980 | Oda et al. | 427/150 |
| 4,265,946 | 5/1981 | Yabe et al. | 427/393.5 |
| 4,275,142 | 6/1981 | Hosaka et al. | 522/121 |
| 4,304,850 | 12/1981 | Koyama et al. | 430/463 |
| 4,339,474 | 7/1982 | Kishida et al. | 522/75 |
| 4,360,628 | 11/1982 | Runavot et al. | 524/508 |
| 4,423,089 | 12/1983 | Sekiya et al. | 427/171 |
| 4,426,504 | 1/1984 | Nandi | 526/282 |

FOREIGN PATENT DOCUMENTS

| | | |
|---|---|---|
| 162570 | 11/1985 | European Pat. Off. |
| 232016 | 8/1987 | European Pat. Off. |
| 2653822 | 6/1977 | Fed. Rep. of Germany |

Primary Examiner—Marion E. McCamish
Assistant Examiner—Arthur H. Koeckert
Attorney, Agent, or Firm—Oblon, Spivak, McClelland, Maier & Neustadt

[57] ABSTRACT

A conjugated diene copolymer comprising (A) 40 to 90 mole % of a conjugated diene component, (B) 0.5 to 10 mole % of an alpha,beta-ethylenically unsaturated carboxylic acid component, (C) 0.1 to 5 mole % of a polyfunctional alkenyl compound component and (D) 5 to 58 mole % of a monoolefinically unsaturated compound component wherein the intrinsic viscosity $[\eta]$ of the copolymer as measured at 30° C. in dimethylformamide is 0.01 to 3.0 dl/g, the width ($\Delta Tg$) of the endothermic transition temperature section determined by a differential scanning calorimetry is 45° to 120° C., and the limit temperature ($T_1$) on the lower temperature side of the endothermic transition temperature section is −40° C. or less. This copolymer, when combined with a photopolymerizable unsaturated monomer and a photosensitizer, provides a photosensitive resin composition which is soluble in aqueous alkali solutions, has an excellent processability and a photocurability, has an excellent rubber elasticity and a transparency even after curing, and has excellent water resistance.

26 Claims, 2 Drawing Sheets

CONJUGATED DIENE COPOLYMER, PROCESS FOR PRODUCING THE SAME, AND PHOTOSENSITIVE RESIN COMPOSITION COMPRISING THE SAME

This is a division of application Ser. No. 07/124,870, filed Nov. 24, 1987, now U.S. Pat. No. 4,927,738.

This invention relates to a conjugated diene copolymer, a process for the production thereof, and a photosensitive resin composition comprising the conjugated diene copolymer.

Synthetic resins have been used as a vehicle for paint or ink or as an adhesive. When the surface to be coated or adhered is flexible, ordinary synthetic resins are inappropriate, and it is necessary to use resins having rubber elasticity, namely the so-called rubber. However, conventional acrylic or diene rubbers are originally insoluble in water and also similarly insoluble even in aqueous alkali or acid solutions. Therefore, they are first dissolved in an organic solvent and then used for said purposes.

Many organic solvents are, however, harmful to human bodies and have an inflammability. Therefore, if an aqueous solvent could be used in the above applications, it would be very useful from the safety standpoint.

Carboxyl group-containing polymers are known as resins soluble in aqueous solvents. These polymers are, however, poor in rubber elasticity and also inferior in transparency which is required for paint or ink vehicles or for adhesives.

A conjugated diene copolymer which is soluble in an aqueous alkali solution is proposed as a resin component of a photosensitive resin composition for a photoresist (Japanese Patent Publication No. 1140/83). This copolymer has, however, an insufficient transparency and also has room for improvement in rubber elasticity. Further, the photocurability of the copolymer per se is insufficient, too.

A photosensitive resin composition has recently been proposed which comprises (I) a copolymer comprising (A) a conjugated diolefin (diene) hydrocarbon and (B) an alpha,beta-ethylenically unsaturated carboxylic acid as the essential components and optionally (C) a monoolefinically unsaturated compound, (II) a photopolymerizable unsaturated monomer and (III) a photosensitizer (Japanese Patent Publication No. 29849/84).

The above photosensitive resin composition has a number of advantages; however, it has been found that the composition has still a problem in respect of transparency and processability due to the properties inherent to the copolymer (I).

When in the above photosensitive resin composition, a large amount of the photopolymerizable unsaturated monomer is used for the purpose of increasing the photosensitivity of the composition or a large amount of a polyfunctional unsaturated monomer giving a high degree of curing is used for the purpose of increasing the strength after cure of the composition, it has been found that a marked reduction in the elasticity of the composition results. Moreover, when the elasticity of the copolymer per se is intended to be increased in order to increase the elasticity of the resin composition, the time for developing the composition with an aqueous developing solution is extremely elongated, and when the amount of the alpha,beta-ethylenically unsaturated carboxylic acid component (B) in the copolymer is intended to be increased in order to shorten the development time, the glass transition temperature (Tg) of the copolymer becomes higher and the elasticity and the water resistance after photocuring are impaired.

The inventors of this invention have made extensive research in order to solve the above-mentioned technical problems of the prior art. As a result, it has been found that the contradictory problems of high elasticity, high water resistance and easy developability can be solved by restricting to a specific range the width of the composition distribution of the above-mentioned copolymer, which is defined as the width ($\Delta Tg$) of the endothermic transition temperature section of the copolymer determined by a differential scanning calorimetry (DSC).

An object of this invention is to provide a novel rubbery copolymer capable of giving a photosensitive resin composition which is soluble in aqueous alkali solutions and excellent in processability, photocurability and water-resistance and has an excellent rubber elasticity and transparency even after curing.

A further object of this invention is to provide a process for producing said rubbery copolymer.

A still further object of this invention is to provide a photosensitive resin composition comprising said copolymer.

Figure 1B:
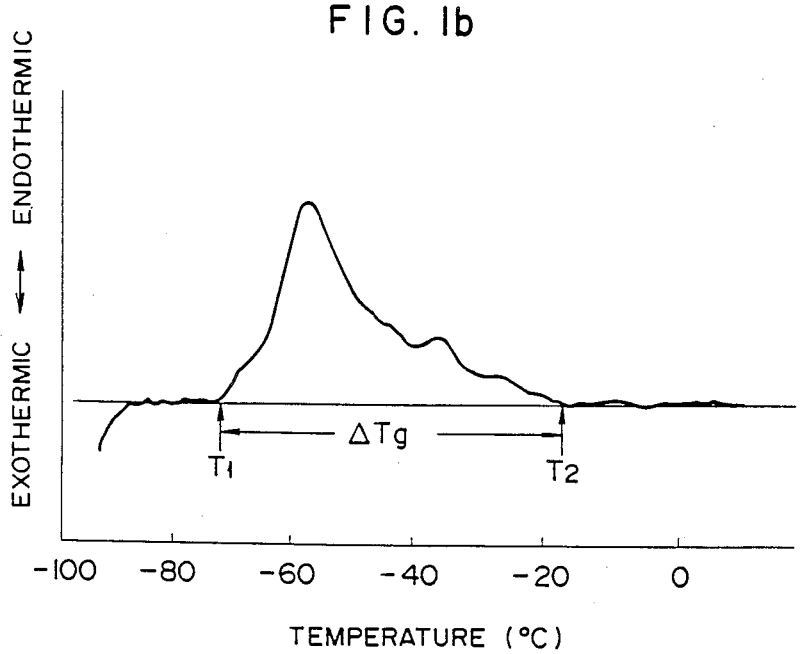
Figure 2:
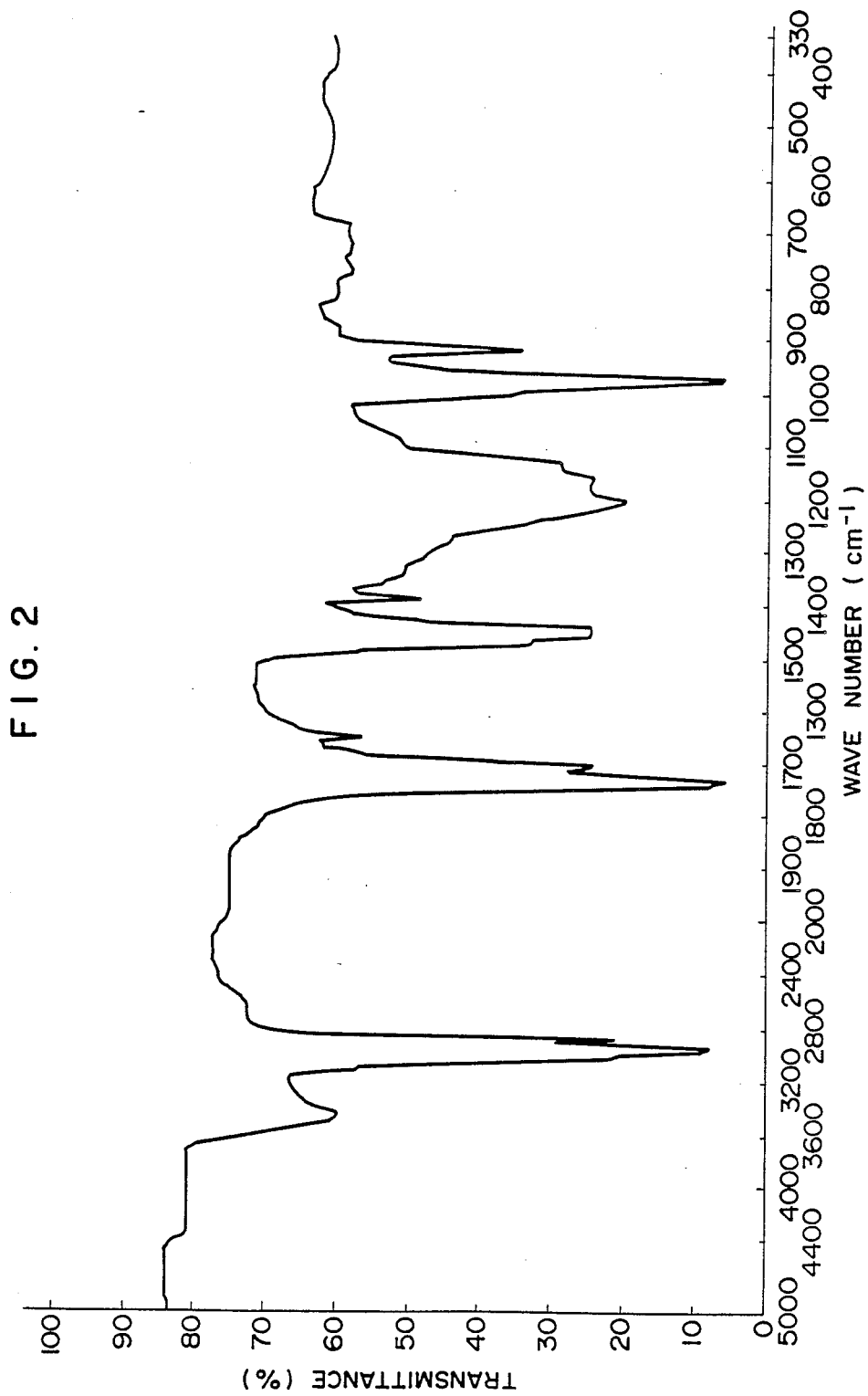

Other objects and advantages of this invention will become apparent from the following description and the accompanying drawings. In the accompanying drawings, FIG. 1a shows DSC charts of the copolymer of this invention obtained in Example 1, FIG. 1b is a differentiation curve thereof and FIG. 2 is an infrared absorption spectrum of the copolymer of this invention obtained in Example 1.

According to this invention, there is provided a substantially random conjugated diene copolymer comprising (A) 40 to 90 mole % of a conjugated diene component, (B) 0.5 to 10 mole % of an alpha,beta-ethylenically unsaturated carboxylic acid component, (C) 0.1 to 5 mole % of a polyfunctional alkenyl compound component and (D) 5 to 58 mole % of a monoolefinically unsaturated compound component, wherein (1) the intrinsic viscosity [$\eta$] as measured at 30° C. in dimethylformamide is 0.01 to 3.0 dl/g, (2) the width ($\Delta Tg$) of the endothermic transition temperature section determined by DSC is 45° to 120° C. and (3) the limit temperature ($T_l$) on the lower temperature side of the endothermic transition temperature section is $-40°$ C. or less.

This invention further provides a process for producing a conjugated diene copolymer which comprises polymerizing a monomer mixture of (A) 30 to 90% by weight of a conjugated diene monomer, (B) 0.5 to 10% by weight of an alpha,beta-ethylenically unsaturated carboxylic acid monomer, (C) 0:1 to 10% by weight of a polyfunctional alkenyl compound monomer and (D) 5 to 65% by weight of a monoolefinically unsaturated compound monomer in the presence of a radical polymerization initiator, wherein 20 to 100% by weight of the above amount of component (B), 20 to 80% by weight of the above amount of component (C) and 0 to 50% by weight of the above amount of component (D) are post-added at one time or continuously when the polymerization conversion of the initially added monomers has reached 20 to 85%.

This invention still further provides a photosensitive resin composition comprising (I) the above-mentioned conjugated diene copolymer, (II) at least one photopolymerizable unsaturated monomer and (III) a photosensitizer.

As the above said conjugated diene component (A) can be enumerated 1,3-butadiene, isoprene, chloroprene, 1,3-pentadiene or the like. Butadiene is preferable as the component (A).

The component (A) will yield mainly the following recurring unit:

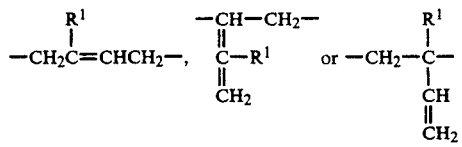

wherein $R^1$ is a hydrogen atom, a methyl group or a chlorine atom.

When the content of the component (A) in the copolymer is less than 40 mole %, the copolymer has a poor rubber elasticity. When the content exceeds 90 mole %, the composition comprising the copolymer is inferior in solid form-retainability, processability and developability. The content is preferably 50 to 85 mole %, more preferably 65 to 85 mole %.

As the alpha,beta-ethylenically unsaturated carboxylic acid component (B) can be enumerated acrylic acid, methacrylic acid, maleic acid, fumaric acid, monoethyl maleate, itaconic acid and the like. Acrylic acid and methacrylic acid are preferable as the component (B). The component (B) will yield mainly the following recurring unit:

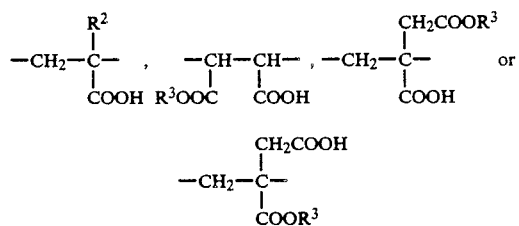

wherein $R^2$ is a hydrogen atom, a methyl group or a carboxyl group and $R^3$ is a hydrogen atom or an alkyl group of 1 to 2 carbon atoms.

When the content of the component (B) in the copolymer is less than 0.5 mole %, the developability of the photosensitive resin composition becomes inferior. When the content exceeds 10 mole %, the rubber elasticity and water resistance of the photocured photosensitive resin composition becomes inferior. The content is preferably 1 to 8 mole %.

As the polyfunctional alkenyl compound component (C) can be enumerated esters of polyhydric alcohols with acrylic or methacrylic acid, for example, ethylene glycol dimethacrylate, ethylene glycol diacrylate, trimethylolpropane trimethacrylate, propylene glycol dimethacrylate, propylene glycol diacrylate, butylene glycol dimethacrylate, hexene glycol dimethacrylate, and the like; divinylbenzene; trivinylbenzene; and the like. Ethylene glycol dimethacrylate and divinylbenzene are preferable as the component (C).

The component (C) will yield mainly the following recurring unit, when, for example, an ester of a polyhydric alcohol with acrylic acid is applied:

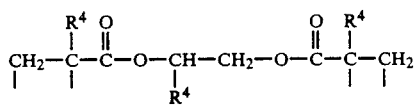

wherein $R^4$ is a hydrogen atom or a methyl group.

When the content of the component (C) is less than 0.1 mole %, the transparency of the copolymer (I) and the processability become inferior when applying or laminating the photosensitive resin composition to a substrate. When the content exceeds 5 mole %, the developability of the photosensitive resin composition and the strength of photocured plate become inferior. The content is preferably 0.5 to 3 mole %.

As the monoolefinically unsaturated compound component (D) can be enumerated methyl acrylate or methacrylate, ethyl acrylate or methacrylate, n-butyl acrylate or methacrylate, alpha-ethylhexyl acrylate or methacrylate, n-octyl acrylate or methacrylate, dodecyl acrylate or methacrylate, methoxyethyl acrylate or methacrylate, ethoxyethyl acrylate or methacrylate, butoxyethyl acrylate or methacrylate, cyanoethyl acrylate or methacrylate, hydroxyethyl acrylate or methacrylate, hydroxypropyl acrylate or methacrylate, styrene, acrylonitrile, vinylidene fluoride, vinyl chloride and the like. These monomers can be used alone or in combination of two or more depending upon the application purpose of the composition comprising the copolymer.

The component (D) will yield the following recurring unit when, for example, an acrylic acid ester is applied:

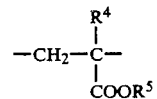

$R^4$ has the same meaning as defined above $R^5$ is a straight or branched chain alkyl group of 1 to 12 carbon atoms or a straight or branched alkoxyalkyl group of 1 to 12 carbon atoms.

The content of the component (D) in the copolymer is 5 to 58 mole %, preferably 10 to 50 mole %. When the content is less than 5 mole %, the relative contents of the components (A), (B) and (C) become larger and the copolymer becomes inferior in compatibility with the photopolymerizable unsaturated monomer (II) and it becomes difficult to obtain a uniform photosensitive resin composition. When the content of the component (D) is more than 58 mole %, the rubber elasticity of the photocured resin composition becomes inferior.

The copolymer of this invention has an intrinsic viscosity [η], as measured at 30° C. in dimethylformamide, of 0.01 to 3.0 dl/g, preferably 0.1 to 2.0 dl/g. When the intrinsic viscosity is less than 0.01 dl/g, the photosensitive resin composition becomes liquid after being mixed with the photopolymerizable unsaturated monomer (II), and it loses its solid-retainability, and it becomes difficult to handle such composition as a solid plate. When the intrinsic viscosity exceeds 3.0 dl/g, the photosensitive resin composition becomes inferior in processability.

The width (ΔTg) of the endothermic transition temperature section of the substantially random conjugated diene copolymer of this invention determined by DSC is 45° to 120° C., preferably 45° to 100° C. and the limit temperature on the lower temperature side of the endothermic transition temperature section is −40° C. or less, preferably −45° C. or less.

Herein, the width (ΔTg) of the endothermic transition temperature section determined by DSC is defined as follows: It is a temperature width in the so-called transition zone which ranges from the initial break point to the final break point in the endothermic peak appearing owing to glass transition in the DSC measurement, and this is the value represented by ΔTg in the differentiation curve of FIG. 1b. The limit temperature (Tg) on the lower temperature side of the endothermic transition temperature section is the temperature at the initial break point of the endothermic peak appearing owing to glass transition in the DSC measurement, namely the temperature defined as $T_1$ in the differentiation curve of FIG. 1b.

When the width (ΔTg) of the endothermic transition temperature section is less than 45° C., the resulting photosensitive resin composition containing the photopolymerizable unsaturated monomer (II) is inferior in developability, solid form-retainability and strength after photocuring. When the ΔTg exceeds 120° C., the processability of the copolymer when mixing it with the photopolymerizable unsaturated monomer (II), namely kneadability, and the processability of the photosensitive resin composition become inferior when laminating it to a substrate. When the limit temperature on the lower temperature side of the endothermic transition temperature section is higher than −40° C. the elasticity of the photocured plate becomes low.

The copolymer of this invention can be produced by radical-polymerizing a mixture of the monomers constituting the components (A) to (D) in the predetermined amounts, for example, a mixture of (A) 30 to 90% by weight, preferably 50 to 90% by weight of a conjugated diene monomer, (B) 0.5 to 10% by weight, preferably 1 to 7% by weight of an alpha,beta-ethylenically unsaturated carboxylic acid monomer, (C) 0.1 to 10% by weight, preferably 0.5 to 7% by weight of a polyfunctional alkenyl compound monomer and (D) 5 to 65% by weight, preferably 10 to 50% by weight of a monoolefinically unsaturated compound monomer [(A)+(B)+(C)+(D)=100% by weight], in an aqueous medium or an organic solvent.

In the above polymerization, a molecular weight modifier is used to regulate the molecular weight of the copolymer formed. The amount of the molecular weight modifier used is preferably 0.1 to 5 g per 100 g of the monomer mixture. Polymerization chemicals such as a radical polymerization initiator and the like can be added at one time at the initiation of polymerization or in portions after the initiation of the polymerization.

It is necessary, however, that 20 to 100% by weight of the necessary amount of (B) component 20 to 80% by weight of the necessary amount of (C) component and 0 to 50% by weight of the necessary amount of (D) component be post-added at one time or continuously when the polymerization conversion of the initially added monomers has reached 20 to 85%. This procedure is necessary in order to allow the copolymer obtained to have a desired ΔTg. That is, the post-addition of the (B), (C) and (D) components which give a higher glass transition point (Tg) than that given by the (A) component enables initially the production of a copolymer having a relatively high conjugated diene component content and a lower Tg, and successively the production of a copolymer having a relatively low conjugated diene component content and a higher Tg, whereby copolymer having a desired ΔTg is brought about, which is the purpose of this invention.

The polymerization is conducted at 0°–50° C. in an oxygen-free reactor. The operational conditions such as temperature and stirring can be varied freely on the way of polymerization. Either continuous polymerization or batchwise polymerization can be adopted.

As the radical polymerization initiator, there can be used, for example, organic peroxides such as benzoyl peroxide, cumene hydroperoxide, p-methane hydroperoxide, lauroyl peroxide and the like; diazo compounds such as azobisisobutyronitrile and the like; inorganic compounds such as potassium persulfate and the like; and redox catalysts such as organic peroxidesferrous sulfate combinations and the like. As the molecular weight modifier, t-dodecylmercaptan, a dialkylxanthogen disulfide or the like may be used.

When the copolymer of this invention is exposed to an actinic light such as ultraviolet rays, the residual double bonds of the conjugated diene monomer is three-dimentionally crosslinked by the action of the actinic light, whereby the copolymer is insolubilized in solvents. However, in the case of producing the photosensitive resin composition using said copolymer, the addition of the photopolymerizable unsaturated compound monomer (II) having at least one ethylenically unsaturated group in the molecule and the photosensitizer (III) to the copolymer (I) accelerates the above-mentioned crosslinking reaction and enables a great improvement of the mechanical strength of a printing plate obtained after the crosslinking.

Examples of the photopolymerizable unsaturated compound monomer (II) include unsaturated aromatic compounds such as styrene, alpha-methylstyrene, m-methylstyrene, p-methylstyrene, p-methoxystyrene, diisopropenylbenzene, divinylbenzene and the like; unsaturated nitriles such as acrylonitrile, methacrylonitrile and the like; alkyl acrylates and methacrylates such as methyl acrylate and methacrylate, ethyl acrylate and methacrylate, propyl acrylate and methacrylate, n-butyl acrylate and methacrylate, isobutyl acrylate and methacrylate, tert-butyl acrylate and methacrylate, n-pentyl acrylate and methacrylate, n-hexyl acrylate and methacrylate, 2-ethylhexyl acrylate and methacrylate, n-octyl acrylate and methacrylate, n-decyl acrylate and methacrylate, lauryl acrylate and methacrylate and the like; hydroxyalkyl acrylates and methacrylates such as 2-hydroxypropyl acrylate and methacrylate and the like; alkoxyalkylene glycol acrylates and methacrylates such as methoxypropylene glycol acrylate and methacrylate and the like; alpha,beta-ethylenically unsaturated carboxylic acids and their anhydrides such as maleic acid and anhydride, fumaric acid, crotonic acid, itaconic acid and anhydride, citraconic acid, mesaconic acid and the like; monoesters of alpha,beta-ethylenically unsaturated dicarboxylic acids such as monoethyl maleate, monoethyl fumarate, monoethyl itaconate and the like; dialkyl esters of alpha,beta-ethylenically unsaturated dicarboxylic acids such as dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate, dioctyl itaconate and the like; acrylamides and methacrylamides such as acrylamide, methacrylamide, N,N′-methylenebisacrylamide, N,N′-hexamethylenebisacrylamide and the like; ethylene glycol diacrylates and dimethacrylates; diacrylates and dimethacrylates of polyalkylene glycols (polymers of 2 to 23 alkylene glycol molecules); diacrylates, triacrylates, tetraacrylates, dimethacrylates, trimethacrylates, tetramethacrylates and oligoacrylates of polyols such as glycerine, pentaerythritol, trimethylolalkane, tetramethylolalkane (the alkane is methane, ethane or propane) and the like; and amino group-containing unsaturated monomers such as dimethylaminoethyl methacrylate, dimethylaminopropyl methacrylate, diethylaminoethyl methacrylate, dimethylaminoethyl acrylate, N-dimethylaminoethylacrylamide, N-dimethylaminopropylmethacrylamide, dimethylaminostyrene, diethylaminoethylstyrene and the like.

The photopolymerizable unsaturated compound monomer (II) is used in an amount of 5 to 200 parts by weight, preferably 10 to 100 parts by weight, per 100 parts by weight of the copolymer (I) of this invention. At least two monomers (II) can also be used in combination as long as the total amount of the monomers (II) is within said range. When the monomer (II) is used in an amount of less than 5 parts by weight, a sufficient curing of the resulting photosensitive resin layer and a sufficient improvement in the mechanical strength of a printing plate or the like cannot be expected. When the amount of the monomer (II) exceeds 200 parts by weight, the elasticity of the copolymer is greatly impaired and the solvent resistance is deteriorated.

The photosensitizer (III) used in the photosensitive resin composition includes conventional photopolymerization initiators, for example, alphadiketone compounds such as diacetyl, benzil and the like; acyloins such as benzoin, pivaloin and the like; acyloin alkyl ethers such as benzoin methyl ether, benzoin ethyl ether, benzoin propyl ether and the like; and polynuclear quinones such as anthraquinone, 1,4-naphthoquinone and the like.

The amount of the photosensitizer (III) is 0.1 to 10 parts by weight, preferably 1 to 5 parts by weight, per 100 parts by weight of the copolymer (I) of this invention. When the amount is less than 0.1 part by weight, the resulting photosensitive resin layer is not cured sufficiently. When the amount is more than 10 parts by weight, not all the photosensitizer added takes a part in the curing reaction and such a large amount is not only uneconomical, but also adversely affects the compatibility between the monomer (III) and the copolymer (I) or the monomer (II), resulting in nonuniform dispersion.

The commercial products of the photopolymerizable unsaturated monomer (II) ordinarily contain a small amount of thermal polymerization inhibitor such as p-methoxyphenol or the like. The inhibitor has no adverse effect when the photosensitive resin composition is exposed to light and rather acts as a storage stabilizer for the photosensitive resin composition. Therefore, such a commercial photopolymerizable unsaturated monomer (II) can be used as it is without excluding the thermal polymerization inhibitor in the preparation of the photosensitive resin composition.

The photosensitive resin composition may further contain, if necessary, 0.01 to 2 parts by weight, per 100 parts by weight of the copolymer, of a storage stabilizer such as a hydroxyaromatic compound (e.g. hydroquinone, p-methoxyphenol, p-t-butylcatechol, 2,6-di-t-butyl-p-cresol, pyrogallol or the like), a quinone (e.g. benzoquinone, p-toluquinone, p-xyloquinone or the like), an amine (e.g. phenol-alpha-naphthylamine or the like) or the like. The composition may also contain a basic compound such as triethylamine, dodecyldimethylamine or the like for the acceleration of photocuring.

A letterpress printing plate can be prepared from the copolymer (I) of this invention as follows: To the rubber-like copolymer (I) are added appropriate amounts of the photopolymerizable unsaturated monomer (II) and the photosensitizer (III) and they are thoroughly mixed by means of a kneader, a Brabender or the like, or alternatively, the copolymer (I) is previously dissolved in a solvent, appropriate amounts of the photopolymerizable unsaturated monomer (II) and the photosensitizer (III) are added to the solution, after which the resulting mixture is thoroughly stirred to form a homogeneous solution, followed by removing the solvent under reduced pressure. The photosensitive resin composition thus obtained becomes a rubber-like solid photosensitive resin composition, and hence, is applied to a support by a roll-coater or the like to form a film having a desired thickness, or formed into a film having a desired thickness by compression molding, extrusion molding or the like. A negative film is applied to the photosensitive resin film thus formed and the assembly is exposed to light through the negative film, and then developed to obtain a letterpress printing plate.

The photosensitive resin composition has a high rubber elasticity and hence is very suitable for use as a flexographic printing plate. As the substrate for supporting the photosensitive resin layer, there can be used a substrate having a rubber elasticity substantially equal to that of the photosensitive resin composition. The substrate is, for example, a sheet of natural rubber, styrene-butadiene rubber, butadiene rubber, acrylonitrilebutadiene rubber, isoprene rubber, ethylene-propylene rubber, crystalline 1,2-polybutadiene resin, soft polyvinyl chloride resin or the like. In applications allowing the use of a substrate of a low rubber elasticity, there can be used a film of polyester, polypropylene, polystyrene, nylon, polyvinylidene chloride, polyethylene or the like. As the substrate for the photosensitive resin composition of this invention to be used in applications such as newspaper printing, ordinary commercial printing and the like, there can be utilized, for example, a grained plate of aluminum, ion or magnesium.

One of the features of the photosensitive resin composition of this invention is the developability with a dilute aqueous alkali solution. In this case, the alkali may be an ordinary alkali, for example, sodium hydroxide, potassium hydroxide, lithium hydroxide, ammonia or lithium carbonate, and these may be used in the form of an aqueous solution having a low concentration such as about 0.1 to 1.0% by weight as a developing solution. The composition of this invention can also be developed with an organic solvent such as an alcohol, a ketone, an aromatic hydrocarbon or the like.

The photosensitive resin composition of this invention has a high photosensitivity, so that a short exposure time may be sufficient. In addition, the composition has an excellent solubility in dilute aqueous alkali solutions, and hence can be developed in 10 seconds to 2 minutes. Immediately after drying, the printing plate obtained can be used for printing. Therefore, a great improvement can be achieved in the conventional complicated process for producing a rubber plate for flexographic printing and in the time required therefor. Furthermore, the printing plate produced from the photosensitive resin composition of this invention can be used not only in printing with a solvent type flexographic ink but also in printing with an aqueous flexographic ink because the plate has good water resistance in spite of its solubility into alkali (the aqueous type flexographic ink is taking over the solvent type to minimize an air pollution).

The photosensitive resin composition of this invention can be widely used as a photosensitive material for a letterpress printing plate for newspaper and ordinary commercial printing, a name plate, a printed circuit board, a display, a photoadhesive and the like and can also be used as an adhesive or a vehicle for aqueous or oily paints or inks of photocuring type, both applicable to flexible surfaces.

The copolymer of this invention has still unreacted double bonds due to the conjugated diene component (A) in the main or side chain of the copolymer, so that the copolymer forms a strong three-dimensional network structure upon photoreaction and its water and solvent resistance is enhanced. Moreover, the conjugated diene component (A) in the copolymer imparts to the copolymer a flexibility, namely rubber-elasticity which is required for the flexographic printing plate. The alpha,beta-ethylenically unsaturated carboxylic acid component (B) has an effect of increasing the affinity of the photosensitive resin composition toward dilute aqueous alkali solutions, i.e., of satisfying the alkali developability of the composition. The polyfunctional alkenyl compound component (C) has an effect of improving the transparency and processability of the photosensitive resin composition of this invention. The monoolefinically unsaturated compound component (D) has an effect of improving the mechanical properties (e.g. rubber elasticity, strength, elongation) of a printing plate prepared from the copolymer of this invention and improving the printing surface-properties (e.g. ink receptivity, ink transferability and the like) of the printing plate. Further, since the $\Delta Tg$ and the temperature limit on the lower temperature side of the endothermic transition temperature section have been specified as mentioned previously, a high water-developability is obtained as compared with the prior art even when the copolymer has a high conjugated diene component content and a low carboxylic acid component content, and consequently, all of contradictory properties of easy water-development, water resistance, ink resistance and high elasticity are satisfied simultaneously. That is, by broadening the width $\Delta Tg$, the low Tg component secures high elasticity and water resistance, and the high Tg component (in this invention, the component having a high carboxylic acid content) secures high water-developability.

This invention is explained in more detail by the following Examples. However, these Examples are not given for the purpose of limitation but of illustration.

In the Examples, glass transition temperature was measured by DSC under the following conditions:
    Apparatus: Differential Scanning Colorimeter Model 910 manufactured by Du Pont, U.S.A.
    Temperature elevation rate: 20° C./min
    Cooling means: Liquid nitrogen Processability was examined by allowing a photosensitive resin composition to be wound around a hot roll of 80° to 120° C. A composition showing poor windability and a composition with high stickiness leading to difficulty in processing were both rated as X in respect of processability. A composition having no problem in respect of windability and shrinkage was rated as O. A composition between the above two which could narrowly be processed but caused some difficulties in handling was rated as Δ. A composition whose polymer had a small molecular weight and was unable to retain a solid form was also judged to have such difficulties and rated as X.

Water resistance was judged by exposing the whole surface of a sheet of a photosensitive resin composition to light without a negative pattern for 60 seconds to obtain a cured resin sheet, punching a disc of 3.5 cm in diameter from the cured resin sheet, immersing the disc in 0.1% by weight aqueous sodium carbonate solution kept at 40° C. for 24 hours, and thereafter measuring the degree of swelling ($\Delta V$ %) of the disc.

Ink transferability was judged by exposing a photosensitive resin composition to light through a negative pattern, developing the resulting resin composition to form a letterpress printing plate and conducting printing with a black letterpress ink using the plate. A photosensitive resin composition which gave a printed matter having an image faithful to the original image was rated as in respect of transferability. A photosensitive resin composition which gave a printed matter having blurring or partial absence of image or showing thickened lines or staining due to, for example, swelling of printing plate was rated as X.

Hardness was measured in accordance with JIS K 6301 (Shore hardness A).

EXAMPLE 1

Using the following monomers and polymerization reagents, polymerization was conducted at 30° C. in an autoclave having an internal volume of 20 liters:

| Polymerization recipe | | |
|---|---|---|
| Butadiene | 70 | parts by weight |
| Methacrylic acid | 3 | " |
| Ethylene glycol dimethacrylate | 2 | " |
| Ethyl acrylate | 20 | " |
| Water | 250 | " |
| Sodium dodecylbenzenesulfonate | 5 | " |
| Potassium persulfate | 0.27 | " |
| Tertiary dodecylmercaptan | 0.6 | " |
| Cyanoethylated diethanolamine | 0.15 | " |
| Potassium hydroxide | 0.11 | " |

When the polymerization conversion had reached 60%, 3 parts by weight of methacrylic acid and 2 parts by weight of ethylene glycol dimethacrylate were further added to continue the reaction. After the polymerization conversion of all the monomers added to the polymerization system had reached 90%, 0.2 part by weight, per 100 parts by weight of the monomers, of hydroxylamine sulfate was added to terminate the reaction. Subsequently, the reaction mixture was heated and subjected to steam distillation to remove the unreacted monomers. The residue was subjected to coagulation with an aqueous potassium chloride solution. The resulting crumbs were water-washed and vacuum-dried at 50° C. to prepare a copolymer sample for evaluation. The composition of the copolymer obtained was determined in accordance with a pyrolysis gas chromatography. The content of methacrylic acid was measured by dissolving the copolymer in dioxane and then conducting alkali titration.

As a result, the composition of the copolymer was as follows: butadiene/methacrylic acid/ethylene glycol dimethacrylate/ethyl acrylate=82/4.5/1.3/12.2 by mole.

The copolymer had an intrinsic viscosity of 0.31 dl/g as measured at 30° C. in dimethylformamide.

In order to infer the width of the composition distribution of this copolymer, analysis by DSC was conducted. The DSC chart obtained is shown in FIG. 1a, and its differentiation curve is shown in FIG. 1b.

The width of the endothermic transition temperature section readable from the differentiation curve is defined as $\Delta Tg$. Also, the limit temperature on the lower temperature side of the endothermic transition temperature section is defined as the lower limit temperature $(T_1)$. As a result of measurement, the $\Delta Tg$ was 50° C. and the lower limit temperature $(T_1)$ was −70° C.

The copolymer was measured for infrared absorption spectrum using a sodium chloride plate. The result thereof is shown in FIG. 2.

100.0 g of the above copolymer, 40.0 g of nonaethylene glycol dimethacrylate as a photopolymerizable unsaturated monomer, 2.0 g of benzoyl isopropyl ether as a photosensitizer and 0.1 g of hydroquinone as a storage stabilizer were placed in a 300-ml pressure kneader and kneaded at 60° C. for 20 minutes. They were further kneaded at 70° C. for 5 minutes on a hot roll to prepare a photosensitive resin composition.

5.0 g of the photosensitive resin composition obtained was placed on a styrene-butadiene rubber sheet of 64 cm² in area and 1.0 mm in thickness to prepare a photosensitive resin layer of 1.0 mm in thickness by passing the resulting assembly through an applicator having a clearance of 1.0 mm.

This photosensitive resin layer kept its solid form and had no problem in handling.

The developing time is indicated by the time required for completely dissolving the above photosensitive resin composition having a thickness of 1 mm by spraying a 0.5% by weight aqueous sodium hydroxide solution by means of a spray type developing machine.

Next, a negative pattern having an optical density of 3.5 was placed above the photosensitive resin layer while the clearance was kept 0.3 mm between them and they were exposed to ultraviolet rays from a 250-W ultrahigh-pressure mercury lamp placed 60 cm above the resin layer for 60 seconds. After the exposure, the resin layer was sprayed with 0.5% by weight aqueous sodium hydroxide solution for 1 minute to develop the layer. The unexposed portions of the resin layer were completely dissolved and removed, whereby a letterpress printing plate faithful to the original image was prepared.

The resin plate had a rubber elasticity and its rubber hardness (Shore A hardness measured at 20° C.) was 60.

The whole surface of the above resin layer was also exposed to light without a negative pattern for 60 seconds, and a disc of 3.5 cm in diameter was punched from the resin layer. The disc was immersed in 0.1% by weight aqueous sodium carbonate solution for 24 hours to measure its degree of swelling. The degree of swelling was 0.3%. The letterpress printing plate thus prepared was used in printing with a black letterpress ink, whereby a printed matter showing a good ink transferability was obtained.

EXAMPLE 2

Polymerization was conducted in the same manner as in Example 1, except that the monomers were varied as shown below:

| Proportions of monomers fed | | |
|---|---|---|
| Butadiene | 60 | parts by weight |
| Divinylbenzene | 2 | " |
| Methyl methacrylate | 33 | " |

The monomers were copolymerized with the same recipe as in Example 1. When the polymerization conversion of the above monomers had reached 50%, 3 parts by weight of methacrylic acid and 2 parts by weight of divinylbenzene were further added to continue the reaction. When the polymerization conversion of all the monomers added to the polymerization system had reached 90%, 0.2 part by weight of hydroxylamine sulfate was added per 100 parts by weight of the monomers to terminate the polymerization.

The same subsequent procedure as in Example 1 was repeated to obtain a copolymer having a composition of butadiene/methacrylic acid/divinylbenzene/methyl methacrylate=74/2.3/2.0/21.7 by mole. This copolymer had a $\Delta Tg$ of 63° C. and a lower limit temperature of −65° C.

From this copolymer, a photosensitive resin composition was prepared in the same manner as in Example 1. The composition was tested for properties in the same manner as in Example 1. The results are shown in Table 1.

EXAMPLES 3 TO 6

Copolymers as shown in Table 1 were prepared in the same manner as in Examples 1 and 2, except that the proportions of the monomers initially fed were varied as shown in Table 1. From these copolymers, photosensitive resin compositions were prepared in the same manner as in Example 1. The compositions were exposed to light to prepare letterpress printing plates in the same manner as in Example 1.

Each resin plate showed an excellent water-developability, had a low hardness and a high impact resilience, and gave a printed matter showing a good ink transferability.

COMPARATIVE EXAMPLE 1

Polymerization was conducted in the same manner as in Example 1, except that the following monomers were charged in the following proportions and polymerization was conducted in one stage:

| Proportions of monomers charged | | |
|---|---|---|
| Butadiene | 70 | parts by weight |
| Methacrylic acid | 6 | " |
| Ethylene glycol dimethacrylate | 4 | " |
| Ethyl acrylate | 20 | " |

The copolymer obtained had a composition of butadiene/methacrylic acid/ethylene glycol dimethacrylate/ ethyl acrylate=82/4.5/1.5/12.0 by mole.

The copolymer had a $\Delta Tg$ of 38° C. and a lower limit temperature of −65° C.

In the same manner as in Example 1, a photosensitive resin composition was prepared using the copolymer and tested for physical properties. The composition had a poor water-developability. That is, the development of the composition was substantially impossible when the composition was sprayed with 0.5% by weight aqueous sodium hydroxide solution for longer than 20 minutes.

COMPARATIVE EXAMPLES 2 TO 4

Copolymers as shown in Table 1 were prepared in the same manner as in Comparative Example 1. Photosensitive resin compositions were prepared from the copolymers and tested for physical properties. The results are shown in Table 1.

As is apparent from Table 1, the copolymers of Examples 1 to 6 according to this invention can give photosensitive resin compositions having a good water-developability, water resistance and ink transferability and accordingly suitable for flexographic printing.

On the other hand, in the Comparative Examples, the compositions prepared from copolymers of small $\Delta Tg$ the have very poor water-developability even though they have a good ink transferability, and their development is virtually impossible. Increase of the acid component content in copolymer to make the copolymer water-developable results in a large reduction in water resistance (Comparative Examples 1 to 3). The composition prepared from a copolymer of large $\Delta Tg$ but containing no polyfunctional alkenyl compound monomer is very poor in processability and water-developability (Comparative Example 4).

1. A conjugated diene copolymer comprising (A) 40–90 mole percent of a conjugated diene component, (B) 0.5–10 mole percent of an $\alpha,\beta$-ethylenically unsaturated carboxylic acid component, (C) 0.1–5 mole percent of a polyfunctional alkenyl compound component not in component (A) and selected from the group consisting of esters of polyhydric alcohols with acrylic and methacrylic acids, divinylbenzene and trivinylbenzene and (D) 5–58 mole percent of a monoolefinically unsaturated compound component other than one from component (B), wherein the intrinsic viscosity of the copolymer is 0.01–3.0 dl/g as measured at 30° C. in dimethylformamide, the width ($\Delta Tg$) of the endothermic transition temperature section of the copolymer, as measured by differential scanning calorimetry is 45°–120° C. and the limit temperature ($T_1$) on the lower temperature side of the endothermic transition temperature section is $-40$° C. or less, and wherein said copolymer is prepared by polymerizing a monomer mixture of (a) 30–90% by weight of said conjugated diene monomer, (b) 0.5–10% by weight of said $\alpha,\beta$-ethylenically unsaturated carboxylic acid monomer, (c) 0.1–10% by weight of said polyfunctional alkenyl compound monomer and (d) 5–65% by weight of said monoolefinically unsaturated compound monomer, wherein

TABLE 1

| | | Examples | | | | | | Comparative Examples | | | |
|---|---|---|---|---|---|---|---|---|---|---|---|
| | | 1 | 2 | 3 | 4 | 5 | 6 | 1 | 2 | 3 | 4 |
| Proportions of monomers fed (parts by weight) | | | | | | | | | | | |
| (A) | 1,3-Butadiene | 70 | 60 | 35 | 70 | 70 | 50 | 70 | 64 | 25 | 60 |
| (B) | Methacrylic acid | 3 (3)* | 0 (3)* | 1 (2)* | — | 4 (3)* | 1 (1.5)* | 6 | — | 9 | 3 (3)* |
| (B) | Acrylic acid | — | — | — | 0.5 (2)* | — | — | — | 7 | — | — |
| (C) | Ethylene glycol dimethacrylate | 2 (2)* | — | 1 (2)* | — | 2 (1)* | 2 (2)* | 4 | 6 | 3 | — |
| (D) | Divinylbenzene | — | 2 (2)* | — | 3 (1)* | — | — | — | — | — | — |
| (D) | Ethyl acrylate | 20 | — | 59 | — | — | 43.5 | 20 | — | 63 | — |
| (D) | Methyl methacrylate | — | 33 | — | — | — | — | — | 23 | — | 34 |
| (D) | Styrene | — | — | — | 23.5 | — | — | — | — | — | — |
| (D) | Acrylonitrile | — | — | — | — | 15 (5)* | — | — | — | — | — |
| Composition of copolymer (mole %) | | | | | | | | | | | |
| (A) | 1,3-Butadiene | 82 | 73.3 | 50 | 83 | 74.5 | 65 | 82 | 78.7 | 35 | 74 |
| (B) | Methacrylic acid | 4.5 | 2.3 | 2.5 | — | 4.5 | 2.0 | 4.5 | — | 8.5 | 4.5 |
| (B) | Acrylic acid | — | — | — | 2.0 | — | — | — | 6.3 | — | — |
| (C) | Ethylene glycol dimethacrylate | 1.3 | — | 1.3 | — | 1.0 | 1.3 | 1.5 | 2.0 | 1.3 | — |
| (C) | Divinylbenzene | — | 2.0 | — | 2.0 | — | — | — | 13 | — | — |
| (D) | Ethyl acrylate | 12.2 | — | 46.2 | — | — | 31.7 | 12.0 | — | 55.2 | — |
| (D) | Methyl methacrylate | — | 22.0 | — | — | — | — | — | — | — | 21.5 |
| (D) | Styrene | — | — | — | 13 | — | — | — | — | — | — |
| (D) | Acrylonitrile | — | — | — | — | 20 | — | — | — | — | — |
| Properties of copolymer | | | | | | | | | | | |
| Intrinsic viscosity $[\eta]_{DMF}^{30°\,C.}$ (dl/g) | | 0.31 | 0.51 | 0.65 | 0.50 | 0.35 | 0.89 | 0.52 | 0.23 | 0.63 | 0.39 |
| $\Delta Tg$ (°C.) | | 50 | 63 | 80 | 76 | 55 | 70 | 38 | 35 | 32 | 49 |
| Lower limit temperature (°C.) | | −70 | −65 | −60 | −66 | −63 | −65 | −65 | −62 | −35 | −65 |
| Properties of photosensitive resin composition | | | | | | | | | | | |
| Processability | | O | O | O | O | O | O | O | O | Δ | X |
| Development time (min) | | 1.0 | 0.8 | 0.8 | 2.0 | 1.5 | 0.7 | >20 | >20 | 3.5 | >20 |
| Water resistance (%) | | 0.3 | 0.2 | 0.3 | 0.1 | 0.3 | 0.2 | 0.5 | 0.6 | 8.0 | 0.8 |
| Ink transferability | | O | O | O | O | O | O | — | — | X | — |
| Hardness (Shore A) | | 60 | 65 | 61 | 62 | 61 | 60 | 60 | 65 | 79 | 63 |

Note:
*Figures in parenthesis show the amounts of monomers post-added (parts by weight).

What is claimed is:

(a)+(b)+(c)+(d)=100% by weight, in the presence of a radical polymerization initiator, wherein all of component (a) is initially added, and 20–100% by weight of the above amount of component (b), 20–80% by weight of the above amount of component (c) and 0–50% by weight of the above amount of component (d) are post-added at one time or continuously when the polymerization conversion of the initially added monomers has reached 20–85%.

2. The conjugated diene copolymer according to claim 1, wherein the conjugated diene component (A) is 1,3-butadiene, isoprene, chloroprene or 1,3-pentadiene.

3. The conjugated diene copolymer according to claim 1, wherein the conjugated diene component (A) is 1,3-butadiene.

4. The conjugated diene copolymer according to claim 1, wherein the conjugated diene component (A) has a recurring unit of the structural formula:

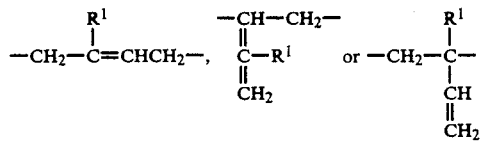

wherein $R^1$ is a hydrogen atom, a methyl group or a chlorine atom.

5. The conjugated diene copolymer according to claim 1, wherein the content of the conjugated diene component (A) is 50 to 85 mole %.

6. The conjugated diene copolymer according to claim 1, wherein the content of the conjugated diene component (A) is 65 to 85 mole %.

7. The conjugated diene copolymer according to claim 1, wherein the alpha,beta-ethylenically unsaturated carboxylic acid component (B) is acrylic acid, methacrylic acid, maleic acid, fumaric acid, monoethyl maleate or itaconic acid.

8. The conjugated diene copolymer according to claim 3, wherein the alpha,beta-ethylenically unsaturated carboxylic acid component (B) is acrylic acid or methacrylic acid.

9. The conjugated diene copolymer according to claim 1, wherein the alpha,beta-ethylenically unsaturated carboxylic acid component (B) has a recurring unit of the structural formula:

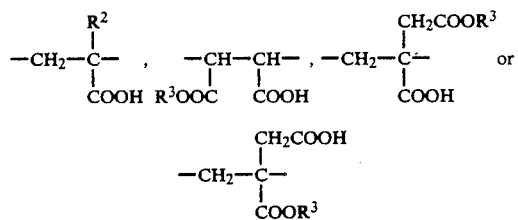

wherein $R^2$ is a hydrogen atom, a methyl group or a carboxyl group and $R^3$ is a hydrogen atom or an alkyl group having 1 to 2 carbon atoms.

10. The conjugated diene copolymer according to claim 5, wherein the content of the alpha,beta-ethylenically unsaturated carboxylic acid component (B) is 1 to 8 mole %.

11. The conjugated diene copolymer according to claim 1, wherein the polyfunctional alkenyl compound component (C) is ethylene glycol dimethacrylate, ethylene glycol diacrylate, trimethylolpropane trimethacrylate, propylene glycol dimethacrylate, propylene glycol diacrylate, divinylbenzene or trivinylbenzene.

12. The conjugated diene copolymer according to claim 8, wherein the polyfunctional alkenyl compound component (C) is ethylene glycol dimethacrylate or divinylbenzene.

13. The conjugated diene copolymer according to claim 1, wherein the polyfunctional alkenyl compound component (C) has a recurring unit of the structural formula:

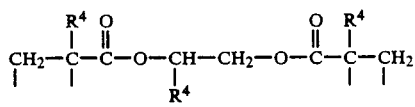

wherein $R^4$ is a hydrogen atom or a methyl group.

14. The conjugated diene copolymer according to claim 10, wherein the content of the polyfunctional alkenyl compound component (C) is 0.5 to 3 mole %.

15. The conjugated diene copolymer according to claim 1, wherein the monolefinically unsaturated compound component (D) is methyl acrylate or methacrylate, ethyl acrylate or methacrylate, n-butyl acrylate or methacrylate, alpha-ethylhexyl acrylate or methacrylate, n-octyl acrylate or methacrylate, dodecyl acrylate or methacrylate, methoxyethyl acrylate or methacrylate, ethoxyethyl acrylate or methacrylate, butoxyethyl acrylate or metharylate, cyanoethyl acrylate or methacrylate, hydroxyethyl acrylate or methacrylate, hydroxypropyl acrylate or methacrylate, styrene, acrylonitrile, vinylidene fluoride, or vinyl chloride.

16. The conjugated diene copolymer according to claim 1, wherein the monoolefinically unsaturated compound component (D) is ethyl acrylate, methyl methacrylate, styrene or acrylonitrile.

17. The conjugated diene copolymer according to claim 1, wherein the monoolefinically unsaturated compound component (D) has a recurring unit of the structural formula:

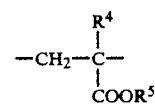

wherein $R^4$ is a hydrogen atom or a methyl group and $R^5$ is a straight or branched chain alkyl group having 1 to 12 carbon atoms or a straight or branched chain alkoxyalkyl group having 1 to 12 carbon atoms.

18. The conjugated diene copolymer according to claim 14, wherein the content of the monoolefinically unsaturated compound component (D) is 10 to 50 mole %.

19. The conjugated diene copolymer according to claim 1, wherein the intrinsic viscosity $[\eta]$ is 0.1 to 2.0 dl/g as measured at 30° C. in dimethylformamide.

20. The conjugated diene copolymer according to claim 1, wherein the $\Delta Tg$ is 45° to 100° C. and the limit temperature ($T_1$) is −45° C. or less.

21. A process for producing a conjugated diene copolymer of claim 1 which comprises polymerizing a monomer mixture of (A) 30 to 90% by weight of a conjugated diene monomer, (B) 0.5 to 10% by weight of an alpha,beta-ethylenically unsaturated carboxylic acid monomer, (C) 0.1 to 10% by weight of a polyfunctional alkenyl compound monomer and (D) 5 to 65% by weight of a monoolefinically unsaturated compound monomer in the presence of a radical polymerization initiator, wherein 20 to 100% by weight of the above amount of the component (B), 20 to 80% by weight of the above amount of the component (C) and 0 to 50% by weight of the above amount of the component (D) are post-added at one time or continuously when the polymerization conversion of the initially added monomers has reached 20 to 85%.

22. The process according to claim 21, wherein the monomer mixture consists of 50 to 90% by weight of the component (A), 1 to 7% by weight of the component (B), 0.5 to 7% by weight of the component (C) and 10 to 50% by weight of the component (D).

23. The process according to claim 21, wherein the polymerization is conducted at 0° to 50° C. in an aqueous medium or an organic solvent.

24. The process according to claim 23, wherein the polymerization is conducted in the presence of 0.1 to 5 g of a molecular weight modifier per 100 g of the monomer mixture.

25. The process according to claim 21, wherein the radical polymerization initiator is an organic peroxide, a diazo compound, an inorganic compound or a redox catalyst.

26. The process according to claim 24, wherein the molecular weight modifier is t-dodecylmercaptan or a dialkylxanthogen disulfide.

* * * * *